(12) United States Patent
Vecchi et al.

(10) Patent No.: US 9,851,419 B2
(45) Date of Patent: Dec. 26, 2017

(54) HALL SENSOR

(71) Applicant: Micronas GmbH, Freiburg (DE)

(72) Inventors: Maria-Cristina Vecchi, Freiburg (DE); Martin Cornils, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 330 days.

(21) Appl. No.: 14/715,931

(22) Filed: May 19, 2015

(65) Prior Publication Data
US 2015/0331068 A1   Nov. 19, 2015

(30) Foreign Application Priority Data
May 19, 2014 (DE) .................. 10 2014 007 208

(51) Int. Cl.
G01R 33/07 (2006.01)
H01L 43/06 (2006.01)

(52) U.S. Cl.
CPC ........... G01R 33/077 (2013.01); G01R 33/07 (2013.01); *H01L 43/06* (2013.01)

(58) Field of Classification Search
CPC ...... G01R 33/07; G01R 33/075; G01D 5/145; H01L 43/065; H01L 43/04
See application file for complete search history.

(56) References Cited

U.S. PATENT DOCUMENTS

| 6,542,068 | B1 | 4/2003 | Drapp et al. | |
| 8,922,207 | B2 | 12/2014 | Ausserlechner | |
| 9,097,753 | B2 * | 8/2015 | Raz | G01R 33/07 |
| 2009/0121707 | A1 * | 5/2009 | Schott | G01R 33/0005 324/207.2 |
| 2012/0016614 | A1 | 1/2012 | Hohe et al. | |
| 2013/0015853 | A1 | 1/2013 | Raz et al. | |
| 2013/0021026 | A1 * | 1/2013 | Ausserlechner | G01L 1/12 324/251 |

(Continued)

FOREIGN PATENT DOCUMENTS

| DE | 101 50 955 C1 | 6/2003 |
| DE | 10 2011 107 767 A1 | 1/2013 |

(Continued)

OTHER PUBLICATIONS

Ralph Steiner Vanha, "Rotary Switch and Current Monitor by Hall-Based Microsystems," Thesis for Swiss Federal Inst. of Tech., Zurich, pp. 1 and 39-53 (1999).

*Primary Examiner* — Jermele M Hollington
*Assistant Examiner* — Suresh K Rajaputra
(74) *Attorney, Agent, or Firm* — Muncy, Geissler, Olds & Lowe, P.C.

(57) ABSTRACT

A Hall sensor including multiple Hall elements which have a first terminal contact and a second terminal contact and a third terminal contact, the multiple Hall elements being electrically connected in series. The first terminal contacts and the third terminal contacts of the individual Hall elements are connected to each other, and the second terminal contacts of the Hall elements are supply voltage terminals or as Hall voltage taps. A beginning of a first branch being electrically connected in series to an end of a second branch, in such a way that the direction of the current flow through the Hall elements of the first branch is counter to the direction of the current flow through the Hall elements of the second branch.

14 Claims, 10 Drawing Sheets

(56) References Cited

U.S. PATENT DOCUMENTS

| | | | | |
|---|---|---|---|---|
| 2013/0021027 A1* | 1/2013 | Ausserlechner | ..... | G01R 33/075 324/251 |
| 2013/0127453 A1* | 5/2013 | Ausserlechner | ....... | G01R 33/07 324/251 |
| 2013/0214775 A1* | 8/2013 | Ausserlechner | ...... | H01L 43/065 324/251 |
| 2014/0070795 A1* | 3/2014 | Kolb | ...................... | G01R 33/07 324/202 |
| 2014/0117983 A1* | 5/2014 | Rohrer | .................. | H01L 43/065 324/251 |

FOREIGN PATENT DOCUMENTS

| | | |
|---|---|---|
| DE | 10 2012 221 009 A1 | 5/2013 |
| EP | 0 954 085 A1 | 11/1999 |
| EP | 2 049 910 B1 | 12/2009 |

\* cited by examiner

HALL SENSOR

This nonprovisional application claims priority under 35 U.S.C. §119(a) to German Patent Application No. 10 2014 007 208.8, which was filed in Germany on May 19, 2014, and which is herein incorporated by reference.

BACKGROUND OF THE INVENTION

Field of the Invention

The present invention relates to a Hall sensor.

Description of the Background Art

Vertical Hall sensors are known from the European patent application EP 9 540 85, which corresponds to U.S. Pat. No. 6,542,068, as well as from DE 101 50 955 C1, in which multiple electrically conductive regions extend perpendicularly to the surface of a substrate and into the substrate for the purpose of forming multiple Hall elements and which have multiple connecting regions of a side face on the surface of the substrate. Hall sensors are used in many technical areas, e.g., to detect the position of switches or actuators contactlessly and thus free of wear. In this area, the use and spatial detection of magnetic fields offer advantages over an optical or mechanical detection, since technologies based on magnetic fields, like those used in Hall sensors, are much less sensitive to contaminants than are optical methods.

A Hall sensor is known from DE 10 2011 107 767 A1, which corresponds to US 20130015853, which is incorporated herein by reference, and which shows four series-connected Hall elements, which are particularly suitable for reducing influences of offset voltages with the aid of the spinning current method.

In connection with lateral Hall sensors for suppressing the offset of the sensor signal, the spinning current method is known from the book titled "Rotary Switch and Current Monitor by Hall-Based Microsystems" by the author Ralph Steiner Vanha, Verlag Physical Electronics Laboratory, Swiss Federal Institute of Technology (ETH) Zürich, 1999, pages 39-53. In the spinning current method, the measurement and current directions at the Hall sensor are continuously further rotated in cycles by, for example, 90° at a certain clock frequency and summed up over all measuring signals of a full rotation by 360°, thereby reducing the influence of offset voltages.

A series arrangement of Hall element having three terminal contacts is furthermore known from EP 2049910 B1, which corresponds to U.S. Pat. No. 9,024,622, which illustrates two Hall elements being connected in parallel in each case. To carry out a calibration, a wire through which current flows is guided over the Hall elements.

SUMMARY OF THE INVENTION

It is therefore an object of the present invention to provide a device which refines the prior art.

According to an embodiment of the invention, a Hall sensor having an increased magnetic sensitivity is provided, the Hall sensor including multiple Hall elements, and each of the Hall elements including a first terminal contact and a second terminal contact and a third terminal contact, and the multiple Hall elements being electrically connected in series. The first terminal contacts and the third terminal contacts of the individual Hall elements are connected to each other, the second terminal contacts of the Hall elements being designed as supply voltage terminals or as Hall voltage taps, and the particular second terminal contact of the Hall element being designed as the middle contact of the Hall element, and a first branch being provided with a first beginning and a first end and, in this connection, the first branch including a series circuit of a first plurality of Hall elements and/or parts of Hall elements, and a second branch being provided with a second beginning and a second end and, in this connection, the second branch including a series circuit of a second plurality of Hall elements and/or parts of Hall elements, and the two branches being electrically connected in series, in this connection the end of the first branch being electrically connected in series to the beginning of the second branch, and the beginning of the first branch being electrically connected in series to the end of the second branch in such a way that the direction of the current flow through the Hall elements of the first branch is counter to the direction of the current flow through the Hall elements of the second branch, so that a vector product J1×B=−(J2×B) is fulfilled, where J1 is the current density vector in the Hall elements of the first branch, and J2 is the current density vector in the Hall elements of the second branch, and B is the vector of an applied magnetic field, and a total of at least four Hall voltage taps are provided in the two branches, two of the Hall voltage taps being disposed in the first branch and two of the Hall voltage taps being disposed in the second branch, and the Hall voltage taps being designed as middle contacts.

The two branches can be electrically connected in such a way that a closed ring is formed from, for example, closely spatially adjacent Hall elements. The algebraic sign of the component of the Hall voltage to be measured, induced by an applied magnetic field, can depend on the direction of the current flow and on the direct of the adjacent magnetic field and on the doping of the semiconductor regions in which the semiconductor elements are provided. Therefore, the algebraic signs of the component of the Hall voltages induced by an applied magnetic field and ascertained at the middle contacts of the Hall elements of the first branch can be provided opposite the corresponding components of the Hall voltages ascertained at the middle contacts of the Hall elements of the second branch.

In the first branch, at least two Hall elements each have a Hall voltage of a first identical polarity, and in the second branch, at least two Hall elements also each have a Hall voltage of a polarity which is opposite the first polarity, at least two differences of Hall voltages may be ascertained with the aid of an advantageous interconnection of the middle contacts of the Hall elements, and the two differences may be added up. With a given operating current, the Hall voltage of the Hall sensor is therefore derived as the sum of at least two differences, ascertained at the four associated Hall voltage taps. In other words, a Hall voltage of the Hall sensor, the Hall voltage of the Hall sensor being referred to below as the so-called total Hall voltage, is ascertained from the sum of Hall voltage differences or, in other words, from the sum of Hall voltage difference signals, each Hall voltage difference being derived from a difference formation of the Hall voltage at one of the middle contacts of a Hall element of the first branch and the Hall voltage at one of the middle contacts of a Hall element of the second branch. The following generally applies to Hall voltage $V_{HSensor}$ of the Hall sensor or, in other words, the following applies to the total Hall voltage with an even number n of Hall voltage taps:

$$V_{HSensor} = \sum_{i=1}^{n/2} (V_{H+i} - V_{H-i})$$

where $V_{H+i}$ represents the Hall voltages ascertained at the middle contacts of the Hall elements of the first branch, and $V_{H-i}$ represents the Hall voltages ascertained at the middle contacts of the Hall elements of the second branch. Studies have shown that the number n is an even number. It has furthermore been demonstrated that the following applies:

$$N-2 \le n \le N$$

where:
N=N1+N2
and N is the total number of Hall elements in the two branches and N1 is a first plurality of Hall elements and/or parts of Hall elements and N2 is a second plurality of Hall elements and/or parts of Hall elements. N is a positive integer in this case. In this connection, N1 and N2 are furthermore each a positive integer or half-integer.

Magnetic sensitivity $S_A$ is furthermore derived from the following relation:

$$S_A = V_{HSensor}/B = 1/B \sum_{i=1}^{n/2} (V_{H+i} - V_{H-i})$$

i.e., the magnetic sensitivity increases along with the increase in the number n of Hall voltage taps in the two branches, without an increase in the current flow through the series-connected Hall elements with a constant voltage supply. According to the invention, the otherwise common loading of the Hall sensors by an increased current for increasing the magnetic sensitivity may be reduced hereby, and the interfering influences, in particular as a result of heating, may be decreased.

In an embodiment, the first terminal contacts and the third terminal contacts are disposed symmetrically around the second terminal contact. Studies have shown that it is particularly advantageous when the Hall elements as a whole have an identical structure and, in particular, a substantially identical layout. One advantage is that the influence of interference due to direct current magnetic fields, and of offset voltages of the individual Hall elements may be reduced and the sensitivity of the Hall sensor increased with the aid of the symmetry of the Hall elements with respect to each other and the symmetry of the two branches with respect to each other, in combination with the opposite current direction in the first branch compared to the second branch.

With the aid of the symmetrical arrangement of the first terminal contacts and the third terminal contacts around the second terminal contacts, it can be ensured that the first terminal contact and the third terminal contact have an essentially identical design and are correspondingly disposed on both sides of the second terminal contact, i.e., each are disposed at the same distance from the particular second terminal contact. A symmetry plane thus passes through the second terminal contact with respect to the arrangement of the first terminal contact and the third terminal contact. A differentiated influence of the first terminal contacts and the third terminal contacts on the second terminal contacts, and thus on the Hall voltage, is reduced hereby. Slight, in particular manufacturing-induced, differences in the shape, material, size or relative arrangement between the first terminal contacts and the third terminal contacts surprisingly play a secondary role in the overall evaluation of the series-connected Hall elements.

In an embodiment, the first branch and the second branch are disposed parallel to a shared straight line or along two different straight lines or along multiple straight lines, wherein the two or the multiple, i.e., the more than two, straight lines are designed to be essentially parallel to each other. The branches can have a short distance from each other. Studies have shown that, due to the adjacent arrangement, it is possible to minimize interference due to structural or spatial differences; in particular, slight deviations in the parallelism in a range of less than fifteen angular degrees between the two straight lines do not result in a reduction in sensitivity in the arrangement according to the invention.

It has proven to be advantageous to select the first plurality of Hall elements and/or parts of Hall elements and the second plurality of Hall elements and/or parts of Hall elements in such a way that a sufficiently reliable and meaningful measurement result is obtained with the aid of the integrative evaluation of the measuring signals, without the number of Hall elements and the spatial size or complexity for manufacturing becoming too great. The supply voltage terminals do not necessarily have to be designed as second terminal contacts. However, the second terminal contacts as supply voltage contacts are the preferred design, due to the easy contactability.

Alternatively, one of the supply voltage terminals or both supply voltage terminals can contact the electrical connecting line between two Hall elements. In other words, at least one of the supply terminals is provided between two Hall elements.

In an embodiment, the supply voltage terminals can be disposed in the ring of the series-connected Hall elements in such a way that the same number of Hall elements and/or parts of Hall elements are disposed between the two supply voltage terminals in both branches. This makes it possible to achieve the desired sensitivity with an uneven number N of series-connected Hall sensors.

The number of series-connected Hall elements can be in a range from four to eighteen, preferably in a range from six to eighteen. With an overall even number N of Hall elements, a balanced and less interference-susceptible Hall sensor is achieved from a large number of Hall elements having a high sensitivity. The implemented number of twelve series-connected Hall elements has proven to be very advantageous in this connection, since it demonstrates a significant efficiency in the sense of a high magnetic sensitivity, with a not all too great structural complexity of the Hall sensor. The magnetic sensitivity increases along with the increase in the number N of symmetrical, electrically series-connected Hall element, the increase in low numbers N of Hall elements being greater than the increase in a higher number N of Hall elements. Studies have shown that the particularly preferred number of series-connected Hall elements is in a range from eight to sixteen.

Studies have shown that it is advantageous to select the same number of first plurality N1 of Hall elements and/or parts of Hall elements as second plurality N2 of Hall elements and/or parts of Hall elements. In other words, it is preferable to dispose the supply voltage terminals in such a way that each of the two branches has the same number of electrically series-connected Hall elements and parts of Hall elements. In other words, with the first plurality of Hall elements and/or parts of Hall elements, the first branch demonstrates the same number of Hall elements and/or parts of Hall elements between the supply voltage terminals as the second branch demonstrates with the second plurality of Hall elements and/or parts of Hall elements.

In an embodiment, exactly two middle terminal contacts of the Hall elements are connected to a first differential amplifier, and exactly two middle terminal contacts of the Hall elements are connected to a second differential amplifier, exactly one of the two middle contacts being from the first branch and exactly one of the two middle contacts being from the second branch. In an embodiment, one of the supply voltage terminals is provided between the middle terminal contacts connected to the first differential amplifier and/or one of the supply voltage terminals is provided between the middle terminal contacts connected to the second differential amplifier.

Moreover, in another embodiment, an integrated multiplexer circuit arrangement can be provided for carrying out a spinning current method, using the supply voltage terminals and the Hall voltage taps, the circuit arrangement and the Hall elements being monolithically integrated into a shared semiconductor body. It is furthermore preferred to dispose the Hall sensor with the integrated circuit arrangement in a single shared housing and to implement the electrical contacting of the Hall sensor via the shared housing. It is understood that at least four Hall elements are provided on the semiconductor body. All Hall elements of the Hall sensor may be manufactured in a single manufacturing process with the aid of the monolithic integration. One advantage is that the spatial arrangement of the Hall elements with respect to each other, as well as the even or uniform provision of the Hall elements or the symmetry of the Hall elements with respect to each other and the improved properties of the Hall sensor according to the invention may be reliably produced.

The interfering offset voltages of the Hall sensor may be particularly advantageous reduced hereby, and the sensitivity and reliability of the sensor according to the invention may be increased.

It is furthermore advantageous that the Hall elements are designed as vertical Hall elements and, in particular, as Hall plates. Magnetic field components running in the direction of the semiconductor surface are detected with the aid of the present vertical Hall elements. Correspondingly, magnetic field components provided perpendicularly to the semiconductor surface may be determined with the aid of lateral Hall elements. In a combination of vertical Hall elements and lateral Hall elements, all three components of a magnetic field which are orthogonally oriented with respect to each other may be determined.

In an embodiment, it is provided that the Hall elements are disposed in a first triplet in the first branch and in a second triplet in a second branch and in a third triplet in a third branch and in a fourth triplet in a fourth branch, the first triplet and the second triplet measuring a first component of a magnetic field, and the third triplet and the fourth triplet measuring a second component of the magnetic field, and the first component being provided perpendicularly to the second component of the magnetic field. It is advantageous of the four branches are disposed symmetrically around a shared center of gravity and if each branch has the same distance from the center of gravity.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
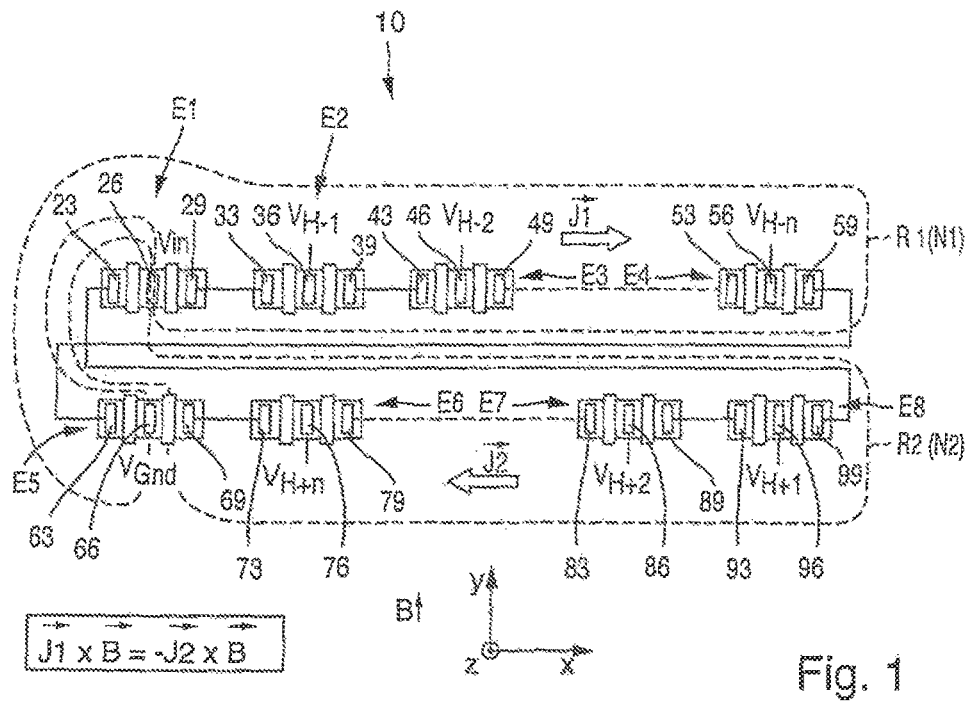
FIG. 1 show a Hall sensor according to the invention, including an annular series circuit of Hall elements having an even number of Hall elements.

FIG. 1 shows a first embodiment of Hall sensor 10 according to the invention, which includes eight Hall elements E1 through E8, Hall elements E1 through E8 being electrically connected in series. Hall elements E1, E2, E3, E4, E5, E6, E7 and E8 are designed as vertical Hall elements, the cross section of individual Hall elements E1 through E8 being identical to each other. A preferred structure is designed according to the prior art and illustrated in detail in FIGS. 12 and 13. In contrast to FIGS. 12 and 13, a top view of the Hall elements provided within a semiconductor surface is illustrated in the present case. The direction of a magnetic field B to be measured points in a y direction, i.e., the direction of a magnetic field to be measured is in the plane of the drawing or parallel to the semiconductor surface.

Each of Hall elements E1, E2, E3, E4, E5, E6, E7 and E8 has a first terminal contact 23, 33, 43, 53, 63, 73, 83 and 93 as well as a second terminal contact 26, 36, 46, 56, 66, 76, 86 and 96 as well as a third terminal contact 29, 39, 49, 59, 69, 79, 89 and 99. The series circuit is implemented by the fact that, in each case, third terminal contact 29, 39, 49, 59, 69, 79, 89 and 99 is connected to first terminal contact 23, 33, 43, 53, 63, 73, 83 and 93 of Hall element E1, E2, E3, E4, E5, E6, E7 and E8 following in the series. This results in a closed ring of electrically series-connected Hall elements E1, E2, E3, E4, E5, E6, E7 and E8. Second terminal contacts 26, 36, 46, 56, 66, 76, 86 and 96 are designed either as supply voltage terminals or as Hall voltage taps. It should be noted that, according to one embodiment which is not illustrated, additional Hall elements may be inserted, an insertion of the additional Hall elements between third Hall element E3 and fourth Hall element E4 or sixth Hall element E6 and seventh Hall element E7 being shown in the present case.

Second terminal contact 26 of first Hall element E1 is designed as a supply voltage terminal and is connected to a supply voltage $V_{in}$. Second terminal contact 66 of fifth Hall element E5 is designed as another supply voltage terminal and is connected to a reference voltage $V_{gnd}$, reference voltage $V_{gnd}$ being designed as a ground potential. Hall voltages $+V_{H-1}$ through $+V_{H-n/2}$ and $V_{H+1}$ through $V_{H+n/2}$, where n equals eight, may be tapped at the other second terminal contacts 36, 46, 56, 76, 86 and 96.

The closed ring may be divided into a first branch R1 and into a second branch R2, the assignment of all Hall elements to one of the two branches R1 and R2, Hall elements E1, E2, E3, E4, E5, E6, E7 and E8 in the present case, resulting from the two feeding points for supply voltage $V_{in}$ and reference voltage $V_{gnd}$.

First branch R1 has a beginning A1 and an end EN1, end EN1 of first branch R1 being connected to a beginning A2 of second branch R2, and beginning A1 of first branch R1 being connected to an end EN2 of second branch R2. As a result, the current direction through the Hall elements of first branch R1 is counter to the current direction through the Hall elements of second branch 2, and the relation (J1×B)=−(J2× B) applies, where J1 is the current density vector in the Hall elements of first branch R1, and J2 is the current density vector in the Hall elements of second branch R2, and B is the vector of an applied magnetic field.

In the present embodiment, the two feeding points are connected to middle terminal contacts 26 and 66; in other words, the division into the two branches R1 and R2 runs exactly through middle terminal contacts 26 and 66 of first Hall element E1 and fifth Hall element E5 in each case. Correspondingly, a first half of first Hall element E1 is assigned to first branch R1, and the second half of first Hall element E1 is assigned to second branch R2, and in fifth Hall element E5, a first half is also assigned to second branch R2 and a second half is assigned to first branch R1. Moreover, Hall elements E2, E3 and E4 are assigned to first branch R1, and Hall elements E6, E7 and E8 are assigned to second branch R2. First branch R1 has a number of n=3 Hall voltage taps. Second branch R2 has the same number of n=3 Hall voltage taps. First branch R1 furthermore includes a first plurality N1 of Hall elements and parts of Hall elements, and second branch R2 includes a second plurality N2 of Hall elements and parts of Hall elements, first plurality N1 being of the same size as second plurality N2.

The Hall elements are provided along two different parallel, straight lines. The two branches R1 and R2 are disposed in direct spatial proximity to each other, whereby Hall elements E1, E2, E3, E4, E5, E6, E7 and E8 are subject to comparable external conditions, in particular magnetic field conditions, and interfering, differentiated effects are suppressed, in particular during an integrating evaluation of the measuring signals.

Figure 12:
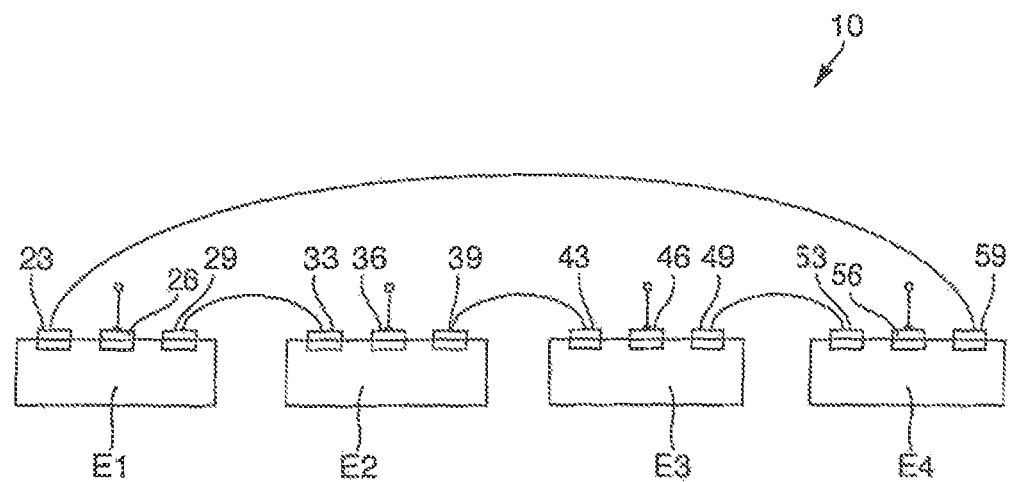
FIG. 12 shows a view of a Hall sensor according to the prior art, including a series circuit of four Hall elements.

An embodiment of a series circuit of a total of four Hall elements E1 through E4 according to the prior art is illustrated in FIG. 12. Each of Hall elements E1 through E4 includes exactly three terminal contacts 23, 26; and 29 or 33, 36; and 39 or 43, 46 and 49 or 53, 56 and 59. The two outer terminal contacts 23, 29 and 33, 39 and 43, 49 and 53 and 59 of each Hall element are each connected to outer terminal contacts 23, 29 and 33, 39 and 43, 49 and 53 and 59 of the two directly adjacent Hall elements. Two of middle terminal contacts 26, 36, 46 and 56 are designed as supply voltage terminals and two more of middle terminal contacts 26, 36, 46 and 56 are designed as Hall voltage taps. Series-connected Hall elements E1 through E4 each demonstrate a symmetrical structure of terminal contacts 23 through 29, i.e., the two outer terminal contacts 23, 29 and 33, 39 and 43, 49 and 53 and 59 of each Hall element have the same distance with respect to particular middle terminal contact 26, 36, 46 and 56 of Hall elements E1 through E4.

Figure 13:
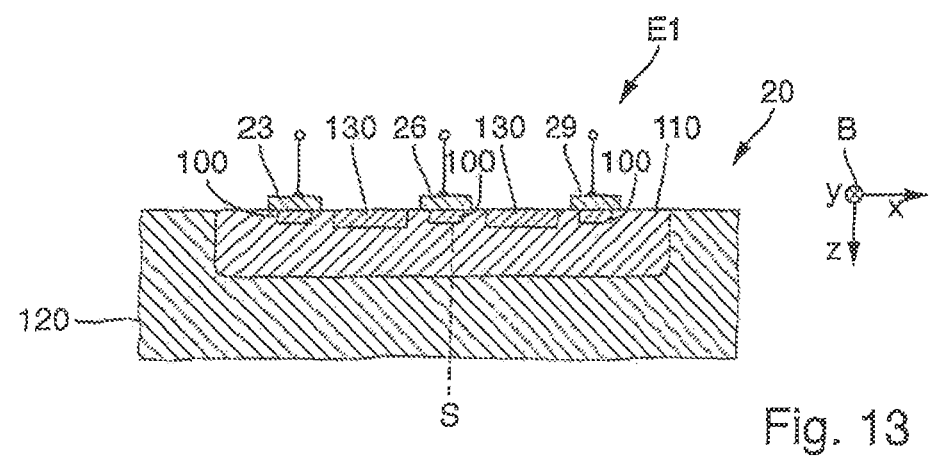
FIG. 13 shows a cross section of a Hall element illustrated in FIG. 12 according to the prior art.

A cross section of an individual Hall element according to the prior art is illustrated in FIG. 13 on the basis of the left Hall element in FIG. 12, whose structure corresponds to the Hall elements in FIG. 1. The Hall element is provided with a symmetrical design with respect to a mirror plane S, which extends in the longitudinal direction through the center of second terminal contact 26 and thus through the Hall element. The geometric dimensions as well as the material composition of all Hall elements of a Hall sensor are selected to be identical or preferably largely identical.

According to the embodiment illustrated in FIG. 13, the direction of a magnetic field to be measured points in a y direction, i.e., into or out of the plane of the drawing.

Figure 2:
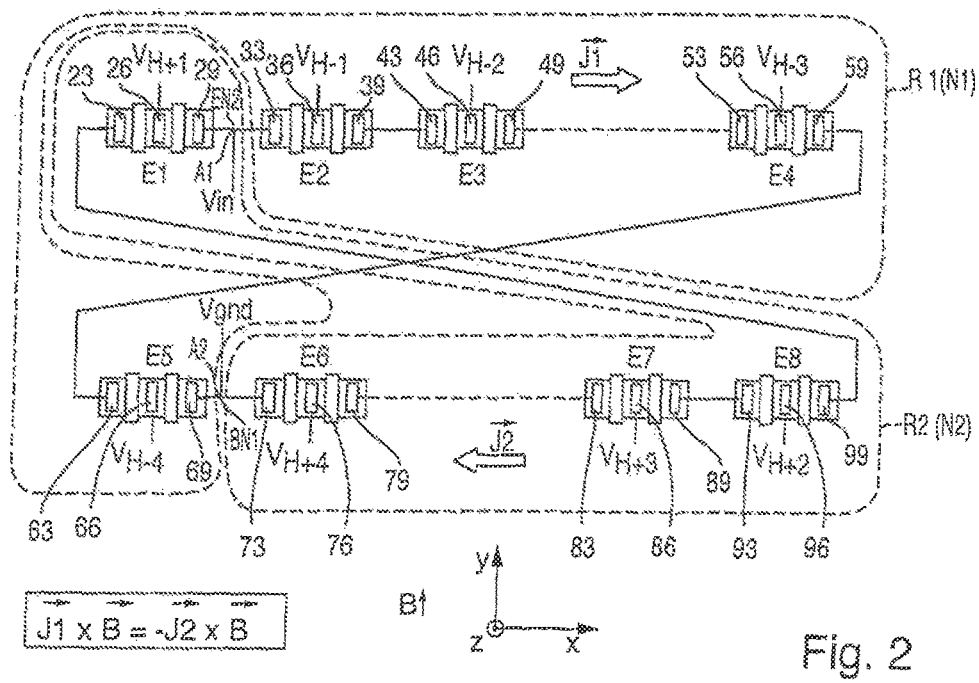
FIG. 2 shows a Hall sensor according to the invention, including an annular series circuit of Hall elements having an even number of Hall elements.

FIG. 2 shows a second embodiment of Hall sensor 10 according to the invention, which includes a total of eight Hall elements E1 through E8. Only the differences from the embodiments explained in connection with the preceding embodiments are discussed below. In contrast to the embodiment illustrated in FIG. 1, the feeding point for supply voltage $V_{in}$ is on the connecting line between first Hall element E1 and second Hall element E2 and not on one of the middle contacts of one of Hall elements E1 through E8. In the same manner, the feeding point for reference voltage $V_{gnd}$ is on the connecting line between fifth Hall element E5 and sixth Hall element E6 and not on one of the middle contacts of one of the Hall elements. As a result, end EN1 of first branch R1 and beginning A2 of second branch R2 are provided at the feeding point of reference voltage $V_{gnd}$, and end EN2 of second branch R2 and beginning A1 of first branch R1 are provided at the feeding point of supply voltage $V_{in}$. The Hall voltage taps are provided on middle contacts 26, 36, 46, 56, 66, 76, 86 and 96 of Hall elements E1 through E8.

Figure 3:
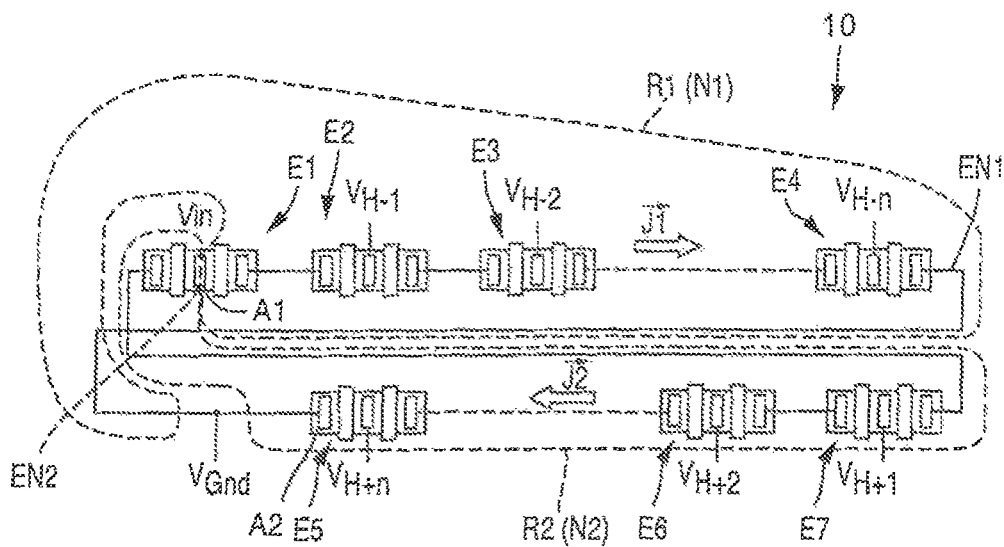
FIG. 3 shows a Hall sensor according to the invention, including an annular series circuit of Hall elements having an uneven number of Hall elements.

FIG. 3 shows a third embodiment of Hall sensor 10 according to the invention, which includes a total of seven Hall elements E1 through E7. Only the differences from the embodiments explained in connection with the preceding embodiments are discussed below. In contrast to the embodiment illustrated in FIG. 1, the feeding point for reference voltage $V_{gnd}$ is on the connecting line between fourth Hall element E4 and fifth Hall element E5 and not on a middle contact of a Hall element. As a result, end EN1 of first branch R1 and beginning A2 of second branch R2 are provided at the feeding point of reference voltage $V_{gnd}$.

Figure 4:
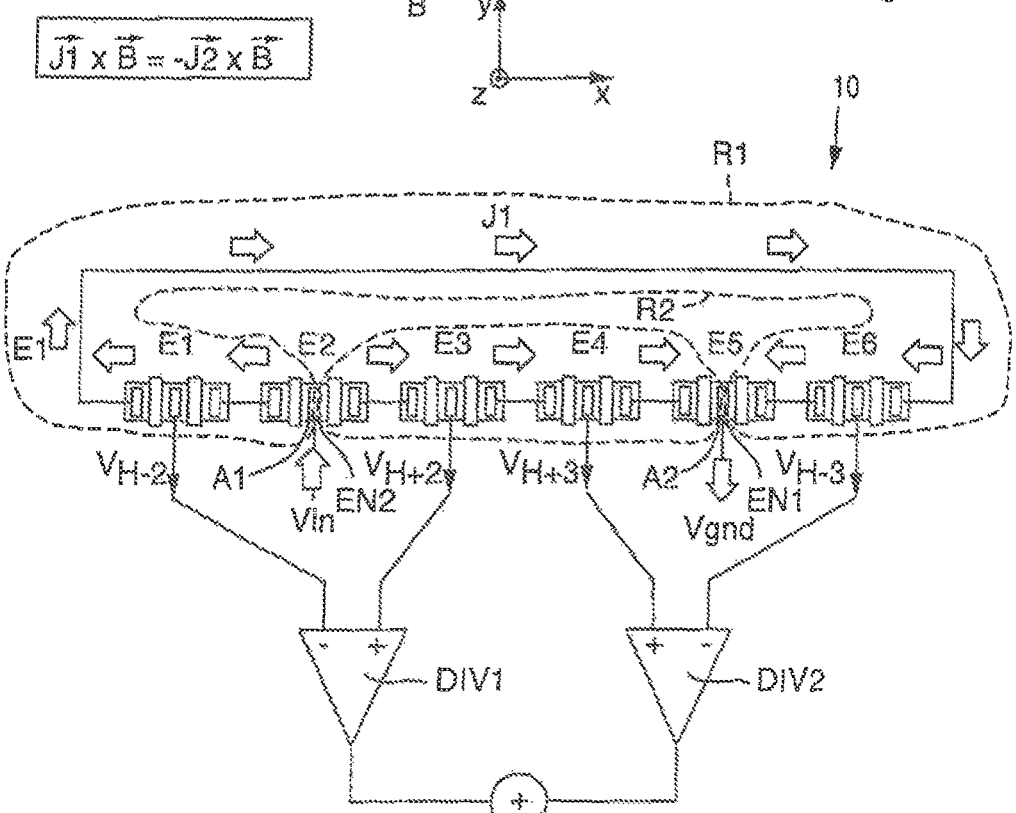
FIG. 4 shows a Hall sensor according to the invention, including a total of six Hall elements disposed on a single straight line.

FIG. 4 shows a fourth embodiment of Hall sensor 10 according to the invention, which includes a total of six Hall elements E1 through E6. Only the differences from the embodiments explained in connection with the preceding embodiments are discussed below. All Hall elements E1 through E6 are provided along a single, shared straight line, first branch R1 and second branch R2 each including two Hall voltage taps. The feeding point for supply voltage $V_{in}$ is on the middle contact of second Hall element E2, and the feeding point for reference voltage $V_{gnd}$ is on the middle contact of fifth Hall element E5. Correspondingly, the left half of second Hall element E2 and first Hall element E1 and sixth Hall element E6 and the right half of fifth Hall element E5 are assigned to first branch R1. The right half of second Hall element E2 and third Hall element E3 and fourth Hall element E4 the left half of fifth Hall element E5 are assigned to second branch R2. As a result, first plurality N1 of Hall elements and parts of Hall elements in first branch R1 and second plurality N2 of Hall elements and parts of Hall elements in second branch R2 are of the same size.

As a result of the distribution of Hall elements E1 through E6 to the two branches R1 and R2, Hall voltage $V_{H-+1}$ may be tapped at the middle contact of first Hall element E1, and Hall voltage $V_{H-+2}$ may be tapped at the middle contact of sixth Hall element E6, and Hall voltage $V_{H+-1}$ may be tapped at third Hall element E3, and Hall voltage $V_{H+-2}$ may be tapped at the middle contact of fourth Hall element E4.

The middle contact of the first Hall element is connected to a non-inverting input of a first differential amplifier DIV1, and the middle contact of the third Hall element is connected to an inverting input of first differential amplifier DIV1. The middle contact of the fourth Hall element is furthermore connected to an inverting input of a second differential amplifier DIV2, and the middle contact of the sixth Hall element is connected to a non-inverting input of second differential amplifier DIV2. First differential amplifier DIV1 has one output, and second differential amplifier DIV2 has one output. A first Hall voltage differential signal is available at the output of first differential amplifier DIV1, and a second Hall voltage differential signal is available at the output of second differential amplifier DIV2. The two outputs of differential amplifiers DIV1 and DIV2 are connected to a summation unit SUM1. The summation unit provides a summation signal at one output, formed from an addition of the first Hall voltage differential signal and the second Hall voltage differential signal according to the following relation:

$$V_{HSensor}(V) = \Sigma_{i=1}^{2}(V_{H+i} - V_{H-i})$$

where $V_{H+i}$ represents the Hall voltages ascertained at the middle contacts of the Hall elements of the first branch, and $V_{H-i}$ represents the Hall voltages ascertained at the middle contacts of the Hall elements of the second branch. In the present embodiment, a series circuit of one Hall element and/or parts of Hall elements E1 through E3 or E4 through E6 is provided between the two inputs of the two differential amplifiers DIV1 and DIV2. A supply voltage terminal is furthermore disposed between the two inputs in each case.

Figure 5:
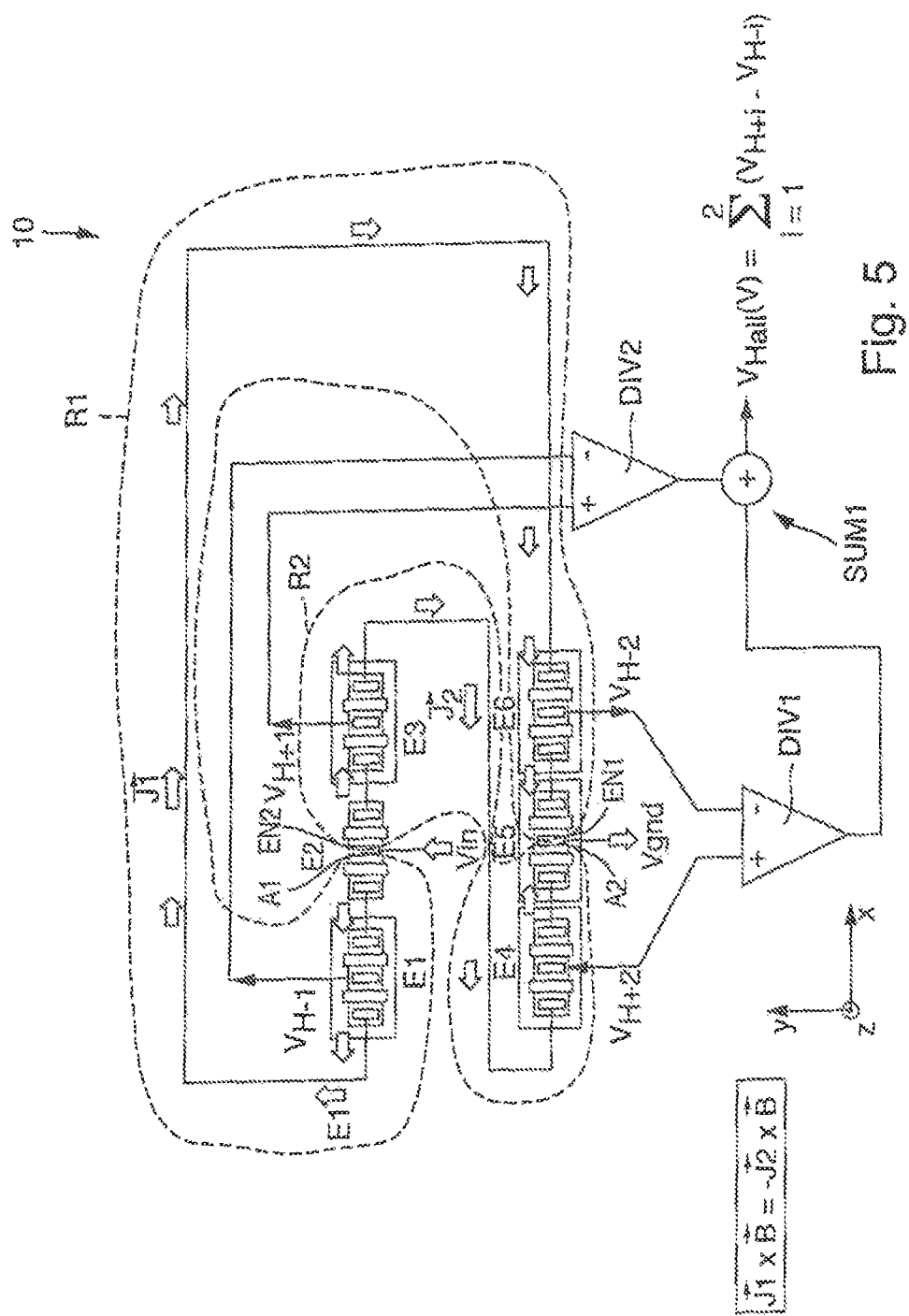
FIG. 5 shows a Hall sensor according to the invention, including a total of six Hall elements disposed on two straight lines.

FIG. 5 shows a fifth embodiment of Hall sensor 10 according to the invention, which includes a total of six Hall elements E1 through E6. Only the differences from the embodiment explained in connection with the illustration in FIG. 4 are discussed below. The Hall elements are disposed along two different straight lines which are parallel to each other. Hall elements E1 through E3 are disposed on the first straight line, and Hall elements E4 through E6 are disposed on the second straight line.

Figure 6:
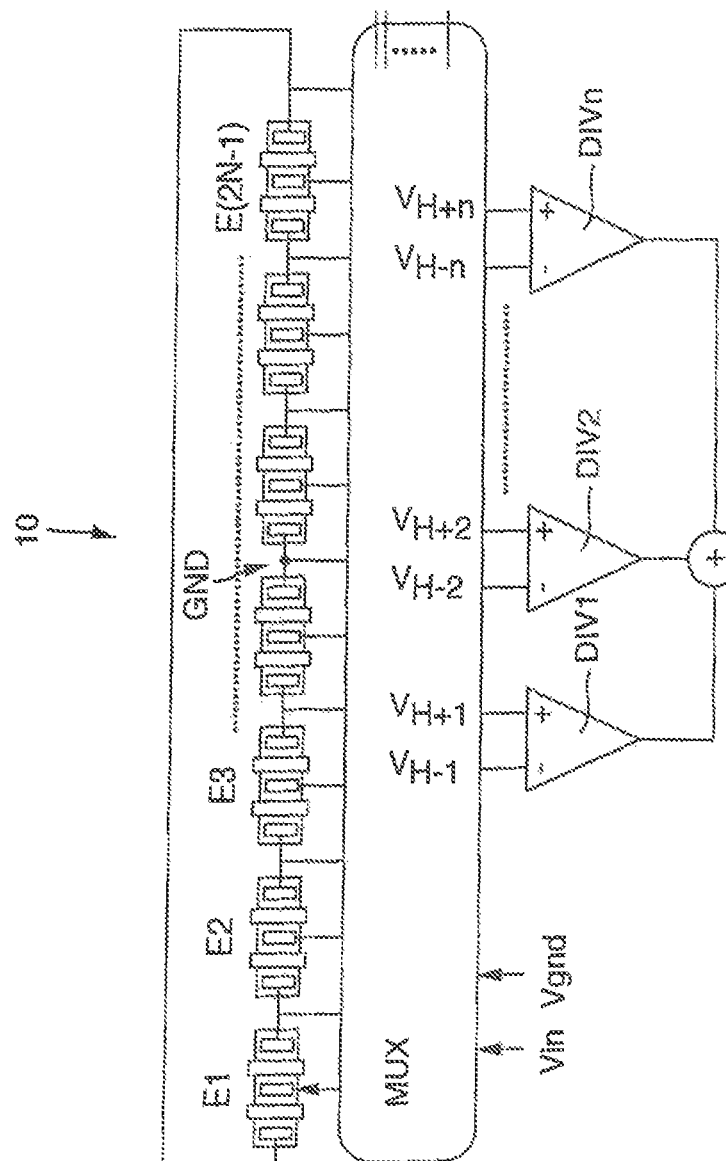
FIG. 6 shows a Hall sensor according to the invention, including a total of n Hall elements disposed on a single straight line.

FIG. 6 shows a sixth embodiment of Hall sensor 10 according to the invention, which includes a total of n Hall elements E1 through En, disposed along a single straight line. Only the differences from the preceding embodiments are explained below. It is understood that the Hall elements may be disposed on two or more straight lines according to embodiments which are not illustrated. In the present case, all middle contacts of the individual Hall elements as well as all connecting lines between the individual Hall elements are connected to inputs of a multiplexer unit MUX. Supply voltage $V_{in}$ and reference voltage $V_{gnd}$ are present at additional inputs of multiplexer unit MUX. The inputs of n/2 differential amplifiers DIV1 through DIVn/2 are connected to outputs of multiplexer unit MUX. All outputs of differential amplifiers DIV1 through DIVn/2 are connected to summation unit SUM1.

One advantage of the present embodiment is that the beginning and end of first branch R1 and second branch R2 may be arbitrarily shifted with the aid of multiplexer unit MUX. Another advantages is that a so-called spinning current method may be very easily and reliably carried out with the aid of multiplexer unit MUX. It should be noted that it is advantageous to monolithically integrate all Hall elements E1 through En into a shared semiconductor body, where n is a natural number greater than three and, in particular, less than thirty.

Figure 7:
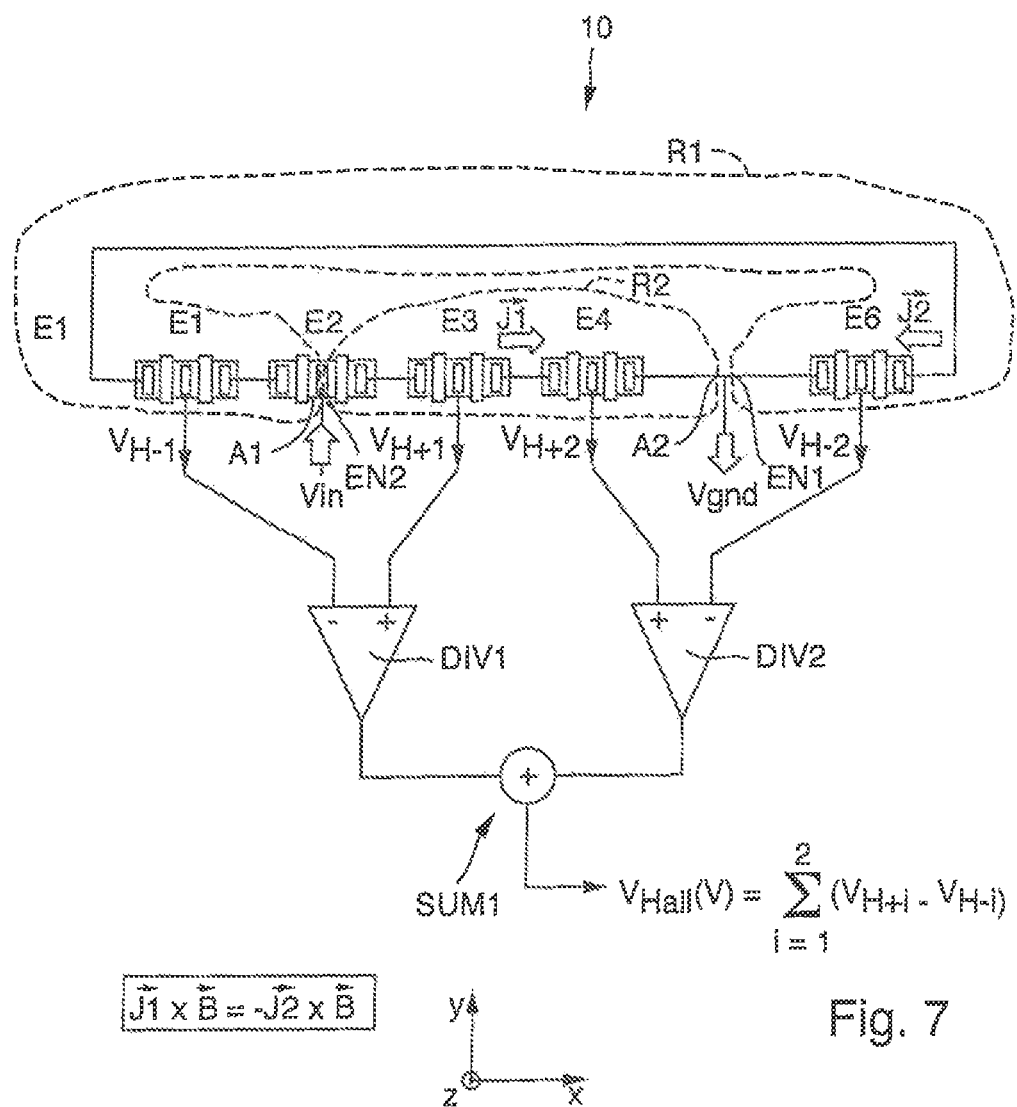
FIG. 7 shows a Hall sensor according to the invention, including a total of five Hall elements disposed on a single straight line.

FIG. 7 shows a seventh embodiment of the Hall sensor according to the invention, which includes a total of five Hall elements E1 through E4 and E6, disposed on a single straight line. Only the differences from the preceding embodiment, explained in connection with the illustration in FIG. 4, are discussed below. In the present case, Hall element E5 is omitted, and reference voltage $V_{gnd}$ is applied to the connecting line between fourth Hall element E4 and sixth Hall element E6.

Figure 8:
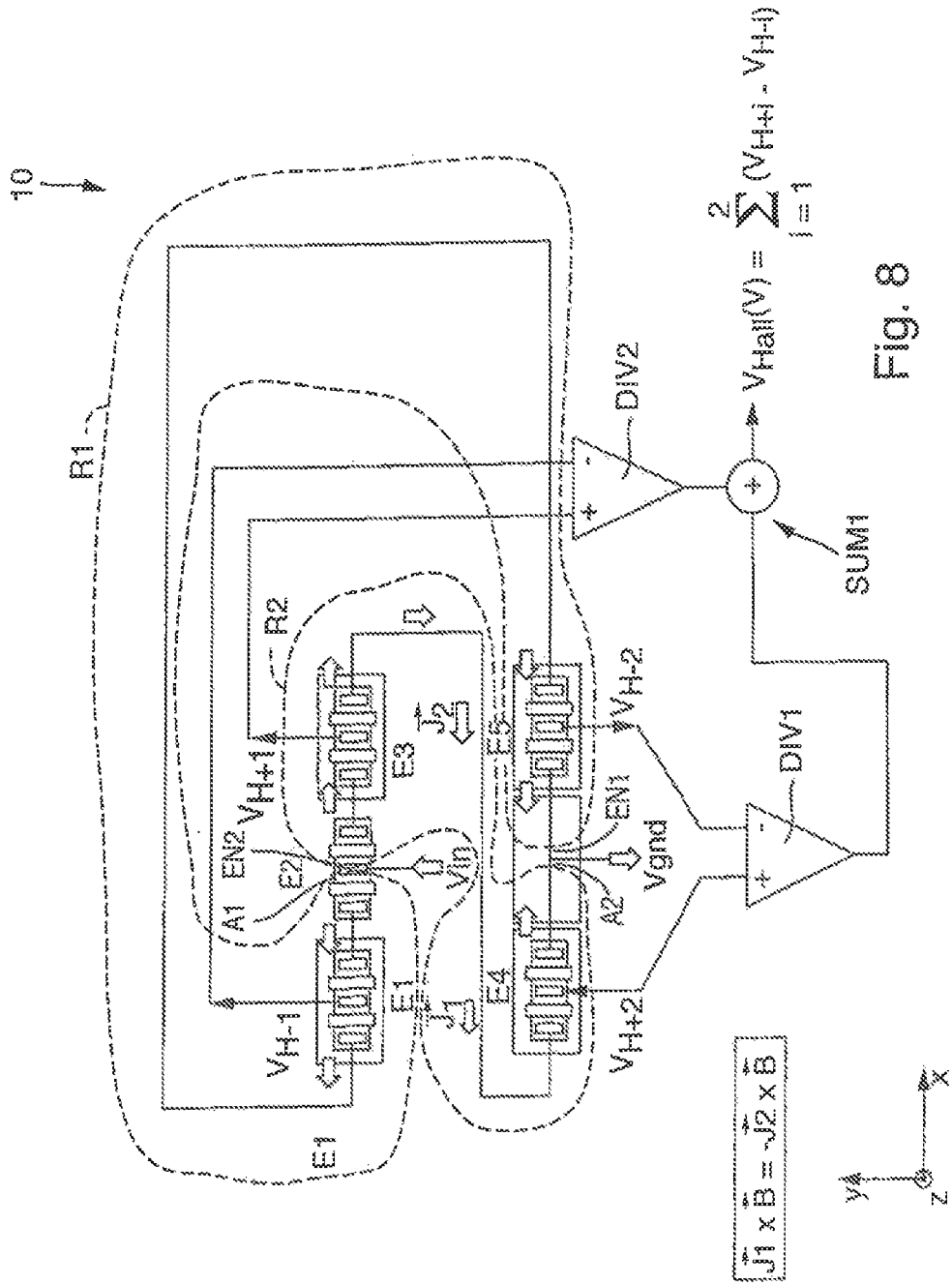
FIG. 8 shows a Hall sensor according to the invention, including a total of five Hall elements disposed on two straight lines.

In contrast to the seventh embodiment, FIG. 8 shows an eighth embodiment of the Hall sensor according to the invention, including a total of five Hall elements E1 through E4 and E6, disposed on two different straight lines which are parallel to each other.

Figure 9:
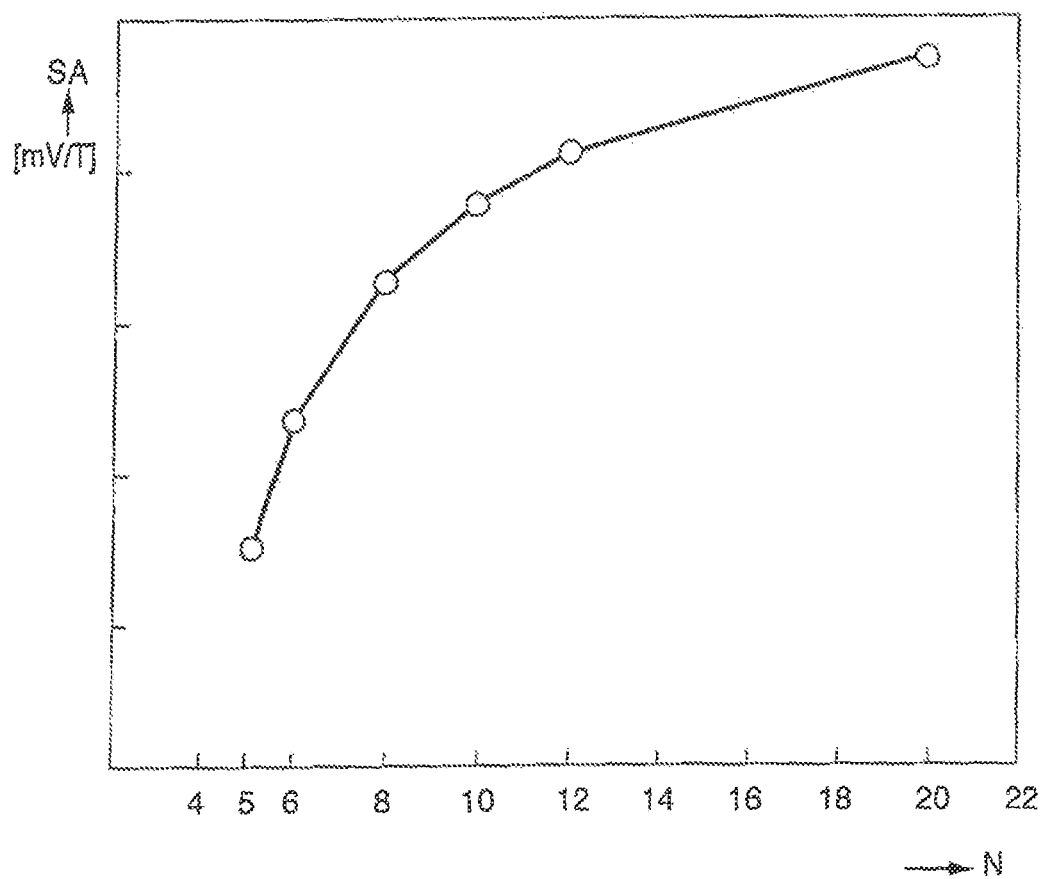
FIG. 9 shows a representation of the relationship between the number n of Hall elements connected in series and the magnetic sensitivity.

The relationship between number n of the Hall voltage taps and magnetic sensitivity $S_A$ in unit mv/T is plotted in FIG. 9

$$S_A = V_{HSensor}/B = 1/B \Sigma_{i=1}^{n/2}(V_{H+i} - V_{H-i})$$

Magnetic sensitivity $S_A$ increases along with the increasing number n of Hall voltage taps, the increase being greater at low numbers than at higher numbers. Extensive studies have shown that the preferred number of Hall voltage taps is particularly advantageous in a range of eight to sixteen. As a result, magnetic sensitivity $S_A$ may be greatly elevated without the current flow through the series-connected Hall elements increasing. In other words, it has been shown that the load on Hall sensor 10 remains low, according to the invention, with an increase in magnetic sensitivity $S_A$, while the reliability of Hall sensor 10 increases.

In particular, an implemented number of n=12 Hall voltage taps has proven to be very advantageous. As a result, with a number n=12, a significant efficiency of the Hall sensor is demonstrated in the sense of a high magnetic sensitivity $S_A$ and a not excessively high structural complexity, i.e., in particular a not excessively high utilization of semiconductor area.

Figure 10:
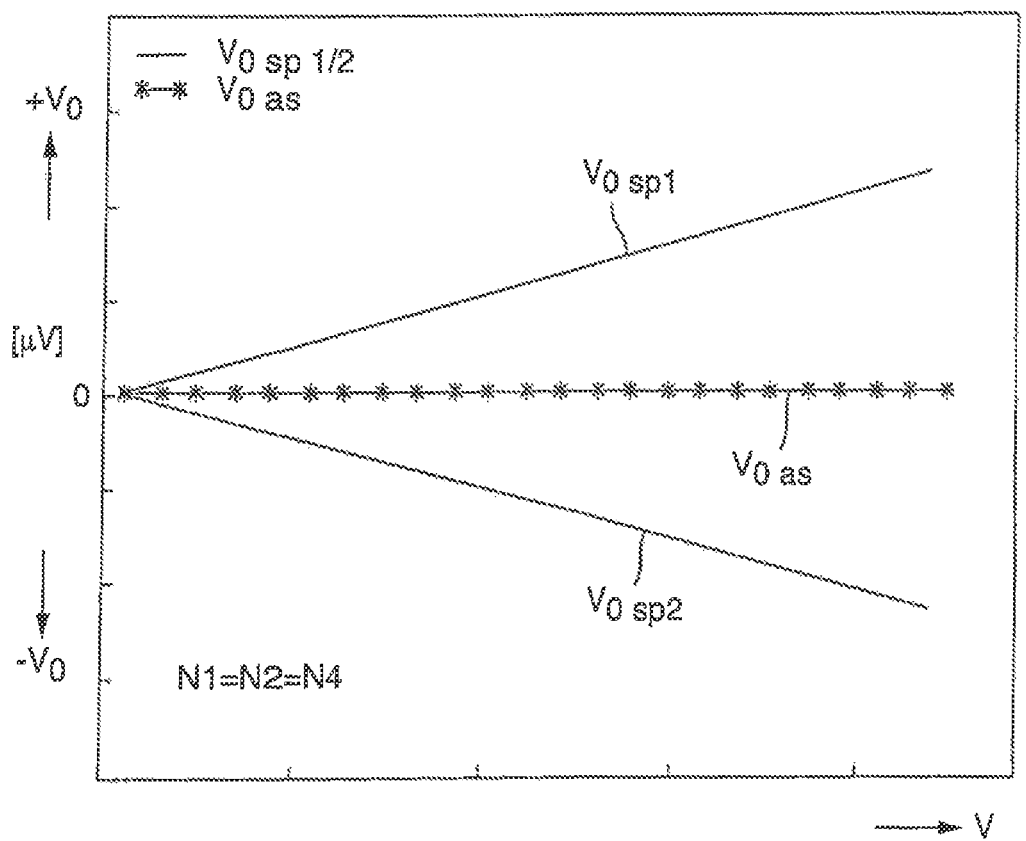
FIG. 10 shows a representation of the relationship between the offset voltage and an applied supply voltage for a Hall sensor having multiple Hall elements with the application and without the application of the spinning current method.

FIG. 10 shows a representation of the relationship between offset voltage $V_O$ in unit μV and a present supply voltage $V_{in}$ in unit V for a Hall sensor which includes eight Hall voltage taps when using and when not using the spinning current method, in the present case, first plurality N1 of Hall elements and parts of Hall elements in first branch R1 being equal to second plurality N2 of Hall elements and parts of Hall elements in second branch R2. For reasons of clarity, offset voltage $V_O$ is represented by a solid line in each case for positive offset voltage $+V_O$ and for negative offset voltage $-V_O$. One preferred circuit arrangement for carrying out the method includes a multiplexer unit MUX according to the embodiment illustrated in FIG. 6. It has been shown that, in a given circuit configuration of the Hall elements, an increasing positive offset voltage $+V_O$ sets in as supply voltage $V_{in}$ increases, represented by a linear progression of first voltage $V_{Osp1}$, or in a given other circuit configuration of the Hall elements, a decreasing negative offset voltage $-V_O$ sets in as supply voltage $V_{in}$ increases, represented by a linear progression of second voltage $V_{Osp2}$.

If the spinning current method and the underlying rotation and summing up of the offset voltages of the individual circuit configurations are used, the result is a progression of offset voltage $V_{OaS}$, the offset measured values after the "spinning" being represented by stars, close to the zero line, i.e., the offset measured values are all in the area of 0 μV. This shows that, not only the sensitivity of the Hall sensor is increased, but the negative influence of a possible offset is also greatly reduced, and the Hall sensor facilitates particularly reliable information about a magnetic field strength to be measured.

Figure 11:
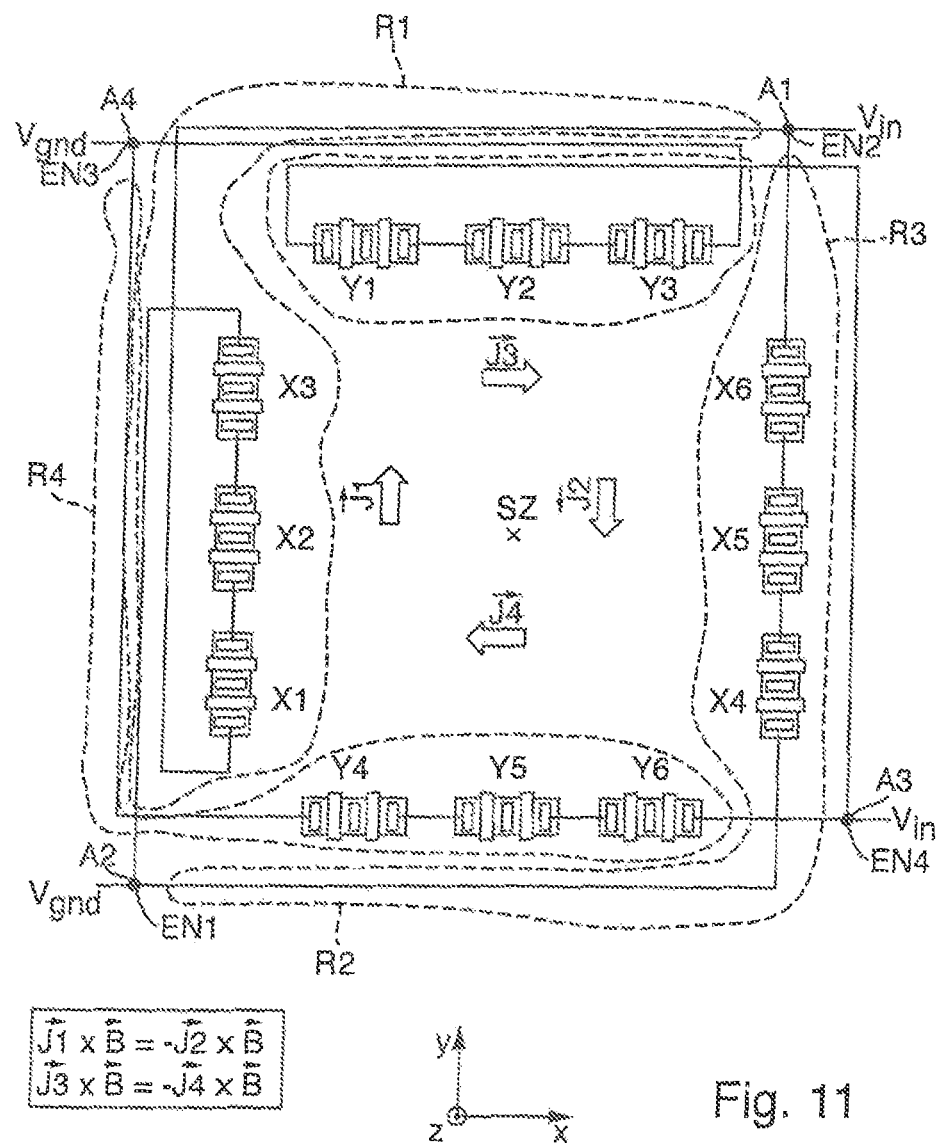
FIG. 11 shows an embodiment in the form of a pixel cell arrangement.

The illustration in FIG. 11 shows a ninth embodiment in the form of a pixel cell arrangement. Only the differences from the preceding embodiments are discussed below. The pixel cell arrangement forms a Hall sensor 10 according to the invention, Hall elements (E1, E2, E3, E4, E5, E6, E7 and E8, . . . ) being disposed in a first triplet X1, X2 and X3 in first branch R1 and in a second triplet X4, X5 and X6 in second branch R2 and in a third triplet Y1, Y2 and Y3 in a third branch R3 and in a fourth triplet Y4, Y5 and Y6 in a fourth branch R4. The four branches R1 through R4 are disposed symmetrically around a shared center of gravity SZ, each of branches R1 through R4 having the same distance from center of gravity SZ. Each triplet of the four branches R1 through R4 includes exactly three vertical Hall elements, the Hall elements of first triplet X1, X2 and X3 and the Hall elements of second triplet X4, X5 and X6 measuring an x component of a magnetic field, and third triplet Y1, Y2 and Y3 and fourth triplet Y4, Y5 and Y6 measuring a y component of the magnetic field. The x component of the magnetic field and the y component of the magnetic field are provided perpendicularly to each other.

Due to the particularly advantageous pixel arrangement, it is possible to create a compact unit for a Hall sensor. It is advantageous to monolithically integrate an evaluating and activating circuit, together with the pixel cell arrangement, on a shared semiconductor substrate in a shared housing. This makes it possible to design a very easy-to-handle, in particular compact as well as robust and reliable Hall sensor 10.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A Hall sensor having a plurality of Hall elements, . . . wherein the first and second branches are electrically connected in series, the first end of the first branch being electrically connected in series to the second beginning of the second branch, and the first beginning of the first branch being electrically connected in series to the second end of the second branch such that a first direction of current flow through the Hall elements of the first branch is counter to a second direction of current flow through the Hall elements of the second branch so that a vector product J1×B=−(J2×B) is fulfilled, where J1 is the current density vector in the Hall elements of the first branch and J2 is the current density vector in the Hall elements of the second branch and B is the vector of an applied magnetic field, and wherein at least four Hall voltage taps are provided, two of the Hall voltage taps being arranged in the first branch and two of the Hall voltage taps being arranged in the second branch and the Hall voltage taps being designed as middle contacts.

2. The Hall sensor according to claim 1, wherein the first branch and the second branch are arranged along a shared straight line or along multiple different straight lines, the multiple straight lines being essentially parallel to each other.

3. The Hall sensor according to claim 1, wherein one of the supply voltage terminals or both supply voltage terminals is/are provided between two Hall elements.

4. The Hall sensor according to claim 1, wherein a first set of middle contacts having exactly two middle contacts of the Hall elements connected to a first differential amplifier, and a second set of middle contacts having exactly two middle contacts of the Hall elements connected to a second differential amplifier, and wherein exactly one of the two middle contacts of the first set is from the first branch and exactly one of the two middle contacts of the second set is from the second branch.

5. The Hall sensor according to claim 4, wherein one of the supply voltage terminals is provided between the middle terminal contacts connected to the first differential amplifier or one of the supply voltage terminals is provided between the middle terminal contacts connected to the second differential amplifier.

6. The Hall sensor according to claim 1, wherein the number of Hall voltage taps is in a range between 6 to 18.

7. The Hall sensor according to claim 1, wherein the first portion of the plurality of Hall elements in the first branch is of a same number as the second portion of the plurality of Hall elements in the second branch.

8. The Hall sensor according to claim 1, wherein an integrated multiplexer circuit arrangement is provided for carrying out a spinning current method, and wherein the circuit arrangement and the Hall elements are monolithically integrated into a shared semiconductor body.

9. The Hall sensor according to claim 1, wherein the first terminal contacts and the third terminal contacts are arranged symmetrically around the second terminal contacts.

10. The Hall sensor according to claim 1, wherein the Hall elements have identical structure.

11. The Hall sensor according to claim 1, wherein the Hall elements are vertical Hall elements.

12. The Hall sensor according to claim 1, wherein the Hall elements are arranged in a first triplet in the first branch and in a second triplet in a second branch and in a third triplet in a third branch and in a fourth triplet in a fourth branch, and wherein the first triplet and the second triplet measure a first component of a magnetic field, and the third triplet and the fourth triplet measure a second component of the magnetic field, and wherein the first component of the magnetic field and the second component of the magnetic field are substantially perpendicular to each other.

13. The Hall sensor according to claim 12, wherein the four branches are arranged symmetrically around a common center of gravity, and wherein each of the branches has a same distance from the common center of gravity.

14. The Hall sensor according to claim 1, wherein a total Hall voltage results from the sum of Hall voltage differences, wherein each Hall voltage difference results from a voltage difference between the Hall voltage at one of the middle contacts of a Hall element of the first branch and the Hall voltage at one of the middle contacts of a Hall element of the second branch.

* * * * *